(12) United States Patent
Huh

(10) Patent No.: US 9,696,380 B2
(45) Date of Patent: Jul. 4, 2017

(54) RELAY CONTROL SYSTEM AND METHOD FOR CONTROLLING SAME

(71) Applicant: SK Innovation Co., Ltd., Seoul (KR)

(72) Inventor: Geun Hoe Huh, Daejeon (KR)

(73) Assignee: SK Innovation Co., Ltd., Seoul (KR)

( * ) Notice: Subject to any disclaimer, the term of this patent is extended or adjusted under 35 U.S.C. 154(b) by 144 days.

(21) Appl. No.: 14/422,045

(22) PCT Filed: Jul. 8, 2013

(86) PCT No.: PCT/KR2013/006035
§ 371 (c)(1),
(2) Date: Feb. 17, 2015

(87) PCT Pub. No.: WO2014/030839
PCT Pub. Date: Feb. 27, 2014

(65) Prior Publication Data
US 2015/0219720 A1 Aug. 6, 2015

(30) Foreign Application Priority Data
Aug. 21, 2012 (KR) .......... 10-2012-0091039

(51) Int. Cl.
*G01R 31/327* (2006.01)
*H01M 10/42* (2006.01)
*H01M 10/46* (2006.01)

(52) U.S. Cl.
CPC ........ *G01R 31/3278* (2013.01); *H01M 10/42* (2013.01); *H01M 10/46* (2013.01); *H01M 2010/4271* (2013.01); *H01M 2220/20* (2013.01)

(58) Field of Classification Search
CPC .. H01M 10/42; H01M 10/46; H01M 2220/20; G01R 31/3278
USPC .......................................... 324/418
See application file for complete search history.

(56) References Cited

U.S. PATENT DOCUMENTS

| 4,488,200 A | 12/1984 | Matsuzaki | |
|---|---|---|---|
| 6,147,498 A * | 11/2000 | Sumiya | H01F 7/18 324/415 |
| 6,657,833 B2 | 12/2003 | Matsuki et al. | |
| 7,242,196 B2 * | 7/2007 | Yudahira | B60L 3/0023 324/418 |
| 2010/0194354 A1 * | 8/2010 | Gotou | B60L 3/003 320/163 |

FOREIGN PATENT DOCUMENTS

| EP | 2361819 A2 | 8/2011 |
|---|---|---|
| JP | 2002175750 A | 6/2002 |

(Continued)

OTHER PUBLICATIONS

Masaki, JP 2001-166950 Machine Translation, p. 1-20.*

*Primary Examiner* — Patrick Assouad
*Assistant Examiner* — Douglas X Rodriguez
(74) *Attorney, Agent, or Firm* — The Webb Law Firm

(57) ABSTRACT

The present invention relates to a relay control system and a control method thereof, and more particularly, to a relay control system and a control method thereof capable of determining whether an unrecoverable failure of a relay due to an unexpected environment, namely, whether the relay is fused, by measuring a voltage on a relay in real time while a battery unit operates in a secondary cell battery using DC power.

7 Claims, 3 Drawing Sheets

(56) References Cited

FOREIGN PATENT DOCUMENTS

| JP | 201114282 A | 1/2011 |
| JP | 2011166950 A | 8/2011 |
| KR | 101132985 B1 | 4/2012 |

* cited by examiner

RELAY CONTROL SYSTEM AND METHOD FOR CONTROLLING SAME

CROSS-REFERENCE TO RELATED APPLICATIONS

This application is the United States national phase of International Application No. PCT/KR2013/006035 filed Jul. 8, 2013, and claims priority to Korean Patent Application No. 10-2012-0091039 filed Aug. 21, 2012, the disclosures of which are hereby incorporated in their entirety by reference.

TECHNICAL FIELD

The present invention relates to a relay control system and a control method thereof, and more particularly, to a relay control system and a control method thereof capable of determining whether an unrecoverable failure of a relay due to an unexpected environment, namely, whether the relay is fused, by measuring a voltage on a relay in real time while a battery unit operates in a secondary cell battery using DC power.

BACKGROUND ART

Unlike an existing internal combustion engine, an electric vehicle (e.g., HEV, PHEV, BEV, or the like) uses electricity as main power or auxiliary power and, to this end, a high voltage battery is mounted thereon to be used. At this point, a battery management system is a controller entirely managing the main battery, which includes measuring a state of charge (SOC) of the high voltage battery. The battery management system allows voltages necessary for driving and controlling the vehicle to be provided from the main battery to each component of the vehicle by performing controller area network (CAN) communication with a hybrid control unit (HCU), a motor control unit (MCU), and a generator control unit (GCU).

In addition, if necessary, the battery management system may protect the main battery by turning off a main relay or cut off voltages provided from the main battery to each component of the vehicle. When the battery management system independently determines that the main battery needs to be protected, or when there are requests from other controllers, the battery management system may turn off the main relay to cut off the voltages provided from the main battery to each component of the vehicle.

However, since controllers (HCU, MCU, GCU, and the like) do not share a request signal for turning off the main relay with each other, each of the controllers may not know whether the battery management system is requested for turning off the main relay by other controllers. For example, when the MCU requests to turn off the main relay from the battery management system during operation of the HCU in relation to the main relay, the main relay may be fused, since a current is supplied to the main relay due to the operation of the HCU, even if the main relay is turned off by the request by the MCU.

Due to the fused main relay, since the battery management system does not manage the SOC or the like of the main battery, overcharge or over-discharge of the main battery may be caused and the overcharge or over-discharge of the main battery may cause explosion of the battery and a danger of an electric shock to a driver.

CITATION LIST

Patent Literature

European patent laid-open publication No. EP02361819 (Publication date: Aug. 31, 2011)

DISCLOSURE OF THE INVENTION

Technical Problem

An aspect of the present invention provides a relay control system capable of greatly improving stability of a battery management system by allowing whether a main relay is fused to be notified prior to a pre-charging period before the main relay is turned on.

Technical Solution

According to an aspect of the present invention, there is provided a relay control system including a battery pack comprising a positive terminal and a negative terminal; a first main relay comprising both terminals connected between the positive terminal of the battery pack and a first node which is one end of a load; a second main relay comprising both terminals connected between the negative terminal of the battery pack and a second node which is another end of the load; a first pre-charge unit connected to the second main relay in parallel and comprising a series circuit configured with a first pre-charge resistor and a first pre-charge relay; a second pre-charge unit connected to the first main relay in parallel and comprising a series circuit configured with a second pre-charge resistor and a second pre-charge relay; and an operational amplifier having both terminals connected to the first and second nodes and outputting a voltage applied to the load to an output terminal.

The relay control system may turn on the first pre-charge relay before the first main relay or the second pre-charge relay is turned on, and according to a voltage value output from the operational amplifier, whether the first main relay or the second pre-charge relay is fused is determined.

The relay control system may turn on the second pre-charge relay, after the first pre-charge relay is turned off or before the second main relay is turned on, and according to a voltage value output from the operational amplifier, whether the second main relay or the first pre-charge relay is fused is determined.

The battery pack may be any one selected from between batteries for power of a hybrid and pure electric vehicle According to another aspect of the present invention, there is provided a relay control method configured by including a first pre-charge unit including a first main relay, a second main relay, an operational amplifier, a first pre-charge relay, a first pre-charge resistor, and a second pre-charge unit including a second pre-charge relay, a second pre-charge resistor. The method includes: turning the pre-charge relay on before the first main relay or the second pre-charge relay is turned on; measuring a voltage value output from the operational amplifier; and according to the measured voltage value, determining whether the first main relay or the second pre-charge relay is fused.

The relay control method may include turning on the first pre-charge relay; a first voltage measuring step for measuring a voltage value applied to the load of the operational amplifier, after a predetermined time elapses; a first determining step for determining whether the voltage value measured in the first voltage measuring step is greater than a preset threshold value; a second determining step for determining whether a voltage value determined in the first voltage measuring step is greater than $V_{T1}$ when the voltage value is greater than the preset threshold value according to the determined result in the first determining step; and a first checking step for checking whether the first main relay is fused when the voltage value measured in the first voltage measuring step is greater than $V_{T1}$ according to the determined result in the second determining step.

The first determining step may further include turning the first pre-charge relay off when the voltage value measured in the first voltage measuring step is smaller than the preset threshold value according to the determined result in the first determining step.

The second determining step may further include a second checking step for checking whether the second pre-charge relay is fused, when the voltage value measured in the first voltage measuring step is smaller than $V_{T1}$ according to the determined result in the second determining step.

The relay control method may further include turning the second pre-charge relay on before the second main relay is turned on or after the first pre-charge relay is turned off; measuring a voltage value output from the operational amplifier; and according to the measured voltage value, determining whether the second main relay or the first pre-charge relay is fused.

The relay control method may further include turning on the second pre-charge relay; a second voltage measuring step for measuring a voltage value applied to the load of the operational amplifier, after a predetermined time elapses; a third determining step for determining whether the voltage value measured in the second voltage measuring step is greater than a preset threshold value; a fourth determining step for determining whether the voltage value determined in the second voltage measuring step is greater than $V_{T2}$ when the voltage value is greater than the preset threshold value according to the determined result in the third determining step; a third checking step for checking whether the second main relay is fused when the voltage value measured in the second voltage measuring step is greater than $V_{T2}$ according to the determined result in the fourth determining step; turning on the second main relay when the voltage value measured in the second voltage measuring step is smaller than the preset threshold value according to the determined result in the third determining step; turning on the first pre-charge relay; and turning off the second pre-charge relay.

The fourth determining step may further include a fourth checking step for checking whether the first pre-charge relay is fused, when the voltage value measured in the second voltage measuring step is smaller than $V_{T2}$ according to the determined result in the fourth determining step.

The predetermined time may be a time taken for a capacitor connected to both terminals of the load to be charged to a certain level or more by a current flowing through the first pre-charge relay or the second pre-charge relay.

The preset threshold value may be set within 5% of a maximum voltage value applied to the load.

Advantageous Effects

According to a relay control system according to an embodiment of the present invention, prior to a pre-charging period before a first main relay is turned on, an effect can be obtained that whether the first main relay or a second main relay is fused can be known.

In addition, since whether the first main relay or the second main relay is fused can be exactly known, stability of the battery management system can be greatly improved and a merit can be obtained that pre-charging can be performed on both positive and negative terminals of a battery pack.

MODE FOR CARRYING OUT THE INVENTION

Figure 1:
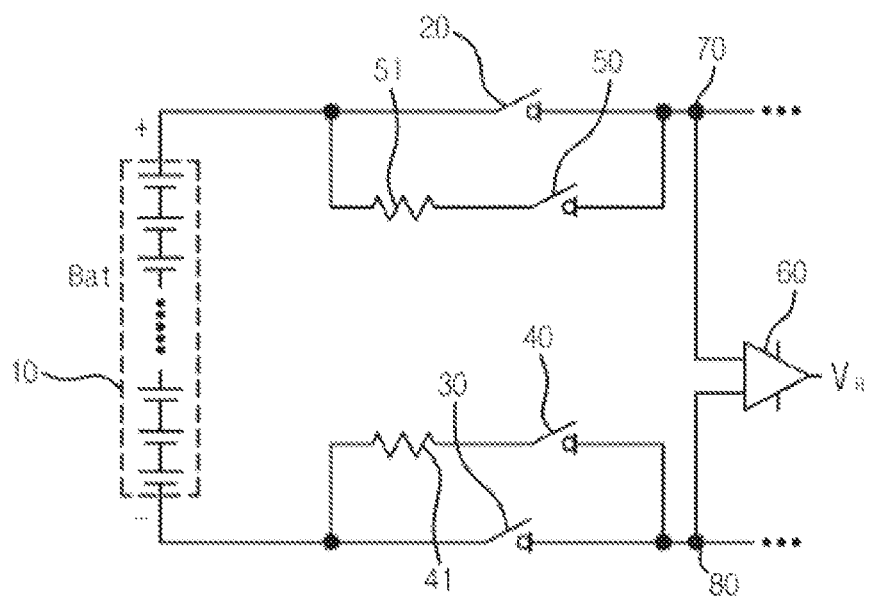
FIG. 1 is a view schematically illustrating a relay control system according to an embodiment of the present invention.

Hereinafter, a relay control system of the present invention will now be described in detail with reference to the accompanying drawings. The drawings set forth below are provided as examples so that technical ideas of the present invention are sufficiently delivered to those skilled in the art. Therefore, the present invention may not be limited to the drawings set forth below and may be embodied in different forms. In addition, like reference numerals refer to like elements throughout the overall specification.

Unless otherwise defined in technical and scientific terms, all terms used herein have the same meaning as commonly understood by one of ordinary skill in the art to which this invention pertains, and detailed descriptions of well-known functions or configurations in the drawings will be omitted in order not to unnecessarily obscure the focus of the present invention.

FIG. 1 is a view schematically illustrating a configuration of a relay control system according to an embodiment of the present invention. Detailed description is provided about a configuration of a relay control system according to an embodiment of the present invention with reference to FIG. 1.

As illustrated in FIG. 1, a relay control system according to an embodiment of the present invention may be constructed by including a battery pack 10, a first main relay 20, a second main relay 30, a first pre-charge unit 40 and 41, a second pre-charge unit 50 and 51, and an operational amplifier 60.

The battery pack 10 may be formed by connecting high voltage batteries having positive and negative terminals in series, and the battery pack 10 according to the present invention may be configured with batteries for power of a hybrid or pure electric vehicle. According to logics registered in the battery management system (BMS), voltages from the battery pack 10 may be provided to or cut off from each component of the vehicle. Accordingly, a relay control system according to the present invention may also correspond to a logic of the battery management system, and check whether a main relay, namely, first and second relays are fused. In such a way, the battery management system may smoothly manage the main battery, namely, the battery pack 10.

Two terminals of the first main relay 20 may be connected between the positive terminal of the battery pack 10 and a first node 70, which is one end of a load, and two terminals of the second main relay 30 may be connected between the negative terminal of the battery pack 10 and a second node 80, which is the other end of the load. The battery management system may protect the battery pack 10 by turning off the first and second main relays 20 and 30, if necessary, and may cut off voltages provided from the battery pack 10 to each component of the vehicle.

The first pre-charge unit is connected to the second main relay 30 in parallel, and may be configured with a first pre-charge resistor 41 and a first pre-charge relay 40 connected in a series circuit. Whether the first main relay 20 or a second pre-charge relay 50 is fused may be determined by turning on the first pre-charge relay before the first main relay 20 or the second main relay 50 is turned on, or may be determined through a voltage output from the operational amplifier 60 and applied to the load.

In addition, the second pre-charge unit is connected to the first main relay 20 in parallel, and may be configured with a second pre-charge resistor 51 and the second pre-charge relay 50 connected in a series circuit. Whether the second main relay 30 or the first pre-charge relay 40 is fused may be determined by turning on the second pre-charge relay 50 before the second main relay 30 is turned on or after the first pre-charge relay 40 is turned off. The second pre-charge unit may also make a determination through the voltage output from the operational amplifier 60 and applied to the load.

Furthermore, the first pre-charge unit or the second pre-charge unit allows a current output from the battery pack 10 to be pre-charged before the current is applied to the first or second relay 20 or 30, and through this, circuit stability may be secured by preventing arc discharge capable of occurring at the time of direct connection to the first or second main relay 20 or 30, or a danger that the first or second main relay 20 or 30 is fused by an inrush current can be prevented.

The operational amplifier 60 may have two terminals connected to the first node 70, which is one end of the load, and to the second node 80, which is the other end of the load, and may output a voltage applied to the load to an output terminal. At this point, a voltage output through the operational amplifier 60 may be measured after a predetermined time elapses after the first or second pre-charge relay 40 or 50 is turned on, where the predetermined time may mean a time taken for a capacitor (not illustrated) connected to both the terminals of the load to be charged to a certain level or greater, namely, to be pre-charged by a current flowing through the first or second pre-charge relay 40 or 50.

In other words, after the first pre-charge relay 40 is turned on and then a predetermined time elapses, whether the first main relay 20 and the second pre-charge relay 50 are fused may be known according to a voltage value of a load circuit, which is output through the operational amplifier 60.

In addition, after the second pre-charge relay 50 is turned on and then a predetermined time elapses, whether the second main relay 30 and the first pre-charge relay 20 are fused may be known according to a voltage value of a load circuit, which is output through the operational amplifier 60.

Figure 2:
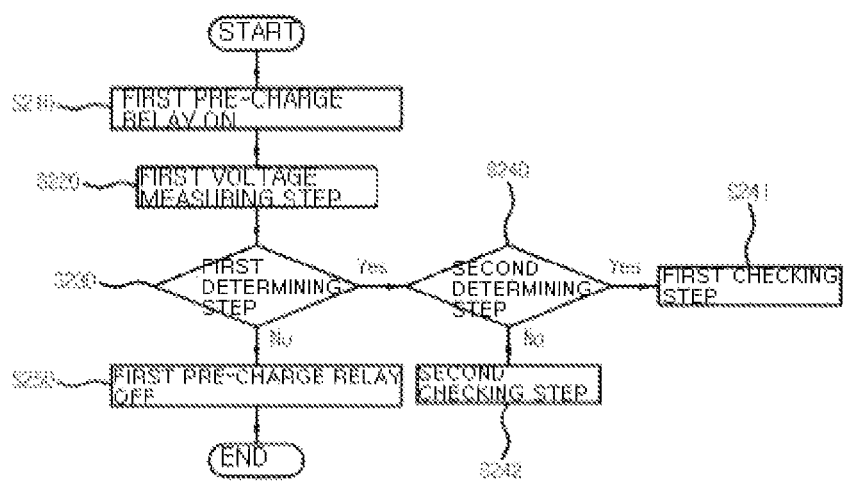
FIG. 2 is a flow chart illustrating a relay control method according to an embodiment of the present invention.

FIG. 2 is a flow chart illustrating a relay control method according to an embodiment of the present invention. Detailed description is provided about the relay control system according to an embodiment of the present invention with reference to FIG. 2.

The relay control method according to an embodiment of the present invention is desirable to be a control method of a relay control system including the battery pack 10, the first main relay 20, the second main relay 30, the first pre-charge unit 40 and 41, the second pre-charge unit 50 and 51, and the operational amplifier 60.

Briefly, the first pre-charge relay 40 is turned on before the first main relay 20 and the second pre-charge relay 50 are turned on, and through this, whether the first main relay 20 or the second pre-charge relay 50 is fused may be determined according to a voltage value output from the operational amplifier 60.

In addition, before the second main relay 30 is turned on and after the second pre-charge relay 50 is turned on, the first pre-charge relay 40 is turned off and through this, whether the second main relay 30 or the first pre-charge relay 40 is fused may be determined according to a voltage value output from the operational amplifier 60.

In the relay control method according to an embodiment of the present invention, as illustrated in FIG. 2, the first pre-charge relay 40 may be turned on before the first main relay 20 and the second pre-charge relay 50 are turned on (step S210).

In a first voltage measuring step S220, the operational amplifier 60 may be measured a voltage value applied to the load, after the first pre-charge relay 40 is turned on and then a predetermined time elapses. At this point, the measured voltage value is referred to as $V_R$. In addition, the predetermined time may mean a time taken for a capacitor (not illustrated) connected to both the terminals of the load to be charged to a certain level or greater with a current flowing through the first pre-charge relay 40.

In a first determining step S230, whether the voltage value measured in the first voltage measuring step S220 is greater than 0V may be determined.

In a second determining step S240, whether the measured voltage value, namely, $V_R$ is greater than $V_{T1}$ may be determined according to the determined result through the first determining step S230, when $V_R$ is greater than 0V. At this point, $V_{T1}$ may be set using the first pre-charge resistor 41 and the capacitor, and an ON time of the first pre-charge relay 40, namely, a predetermined time.

At this point, the predetermined time may become about 2.33R1C, where R1 is a first pre-charge resistance value and C is a capacitance value of a capacitor connected to the load, and according to an embodiment of the present invention, the measured voltage value, namely, $V_{T1}$ after the predetermined time may become about 0.9Vpack, where the Vpack is a voltage of the battery pack.

In a first checking step S241, whether the first main relay 20 is fused may be checked, when the measured voltage value, namely, $V_R$ is greater than $V_{T1}$ according to the result determined through the second determining step S240.

At this point, in a second checking step S242, whether the second pre-charge relay 50 is fused may be checked, when the measured voltage value, namely, $V_R$ is greater than 0V but smaller then $V_{T1}$ according to the result determined through the second determining step S240.

In addition, when the voltage value measured through the first voltage measuring step S220 is smaller than a preset threshold value according to the result determined through the first determining step S230, the first pre-charge relay 40 may be turned off (step S250).

At this point, the preset threshold value may be set as a maximum range voltage value applied to the load in consideration of a sensing error, and the preset threshold value according to an embodiment of the present invention may be set within 5%. The preset threshold value is just an embodiment.

Figure 3:
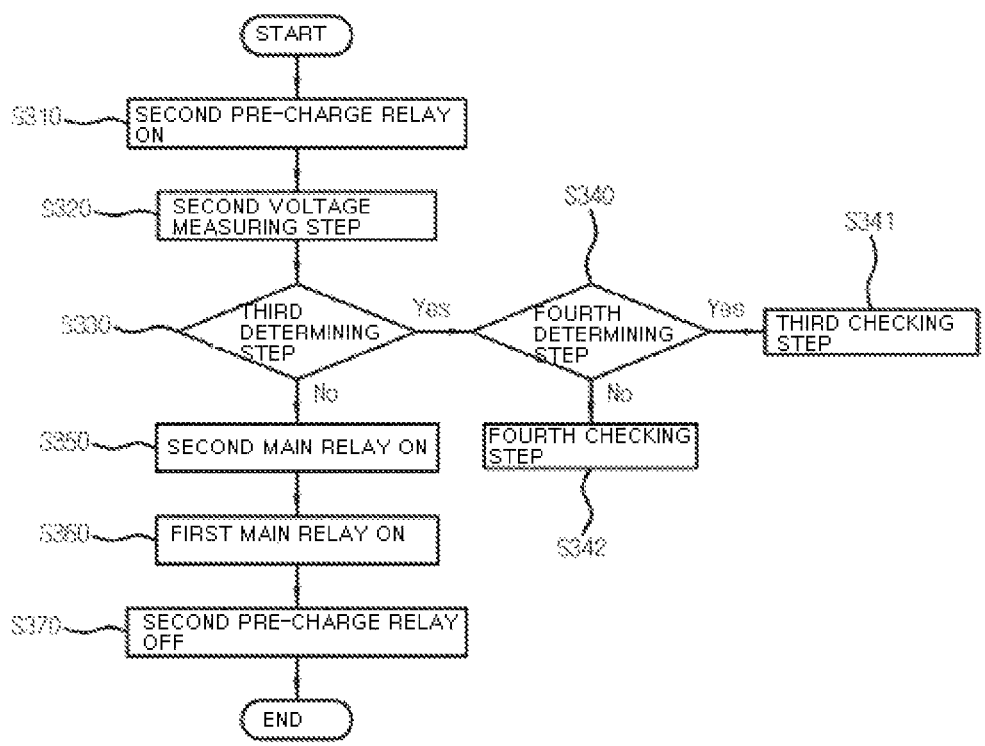
FIG. 3 is a flow chart illustrating a relay control method according to another embodiment of the present invention.

In addition, as illustrated in FIG. 3, the second pre-charge relay 50 may be turned on (step S310), after the first pre-charge relay 40 is turned off, or before the second main relay 30 is turned on.

In a second voltage measuring step S320, the operational amplifier 60 may be measured a voltage value applied to the load, after the second pre-charge relay 50 is turned on and then a predetermined time elapses. At this point, the measured voltage value is referred to as $V_R$. In addition, the predetermined time may mean a time taken for a capacitor (not illustrated) connected to both the terminals of the load to be charged to a certain level or greater with a current flowing through the second pre-charge relay 50.

In a third determining step S330, whether the voltage value measured in the second voltage measuring step S320 is greater than 0V may be determined.

In a fourth determining step S340, whether the measured voltage value, namely, $V_R$ is greater than $V_{T2}$ may be determined according to the determined result through the third determining step S330, when $V_R$ is greater than 0V. At this point, $V_{T2}$ may be set using the second pre-charge resistor 51 and the capacitor, and an ON time of the second pre-charge relay 50, namely, the predetermined time.

At this point, the predetermined time may become about 2.33R2C, where R2 is a second pre-charge resistance value and C is a capacitance value of a capacitor connected to the load, and according to an embodiment of the present invention, the measured voltage value, namely, $V_{T2}$ after a predetermined time may become about 0.9Vpack, where the Vpack is a voltage of the battery pack.

In a third checking step S341, whether the second main relay 30 is fused may be checked, when the measured voltage value, namely, $V_R$ is greater than $V_{T2}$ according to the result determined through the fourth determining step S340.

At this point, in a fourth checking step S342, whether the first pre-charge relay 40 is fused may be checked, when the measured voltage value, namely, $V_R$ is greater than 0V but smaller then $V_{T2}$ according to the result determined through the fourth determining step S340.

In addition, according to the result determined through the third determining step S330, when the voltage value measured through the second voltage measuring step S320 is smaller than the present threshold value, the second main relay 30 may be turned on (step S350). At this point, the preset threshold value may be set as a maximum range voltage value applied to the load in consideration of a sensing error, and the preset threshold value according to an embodiment of the present invention may be set within 5% of the sensing error. The preset threshold value is just an embodiment.

Furthermore, the first main relay 20 may be turned on (step S360), and the second pre-charge relay 50 may be turned off (step S370).

In other words, after the first pre-charge relay 40 is turned on, whether the first main relay 20 or the second pre-charge relay 50 is fused may be determined through comparing voltage values output from the operational amplifier 60. In addition, after the second pre-charge relay 50 is turned on, whether the second main relay 30 or the first pre-charge relay 40 is fused may be determined through comparing voltage values output from the operational amplifier 60. In such a way, additional fuse can be prevented which may be caused by an inrush current capable of occurring when the second main relay 30 operates in a state where it is not detected that the first main relay 20 has been already fused, stability of the battery management system can be significantly improved, and additional pre-charge units may be configured in both the first and second main relays 20 and 30.

While the present invention has been shown and described in connection with the exemplary embodiments, it will be apparent to those skilled in the art that modifications and variations can be made without departing from the spirit and scope of the invention as defined by the appended claims.

The preferred embodiments should be considered in descriptive sense only and not for purposes of limitation. Therefore, the scope of the invention is defined not by the detailed description of the invention but by the appended claims, and all differences within the scope will be construed as being included in the present invention.

DESCRIPTION OF REFERENCE NUMERALS

10: battery pack
20: first main relay
30: second main relay
40: first pre-charge relay
41: first pre-charge resistor
50: second pre-charge relay
51: second pre-charge resistor
60: operational amplifier
70: first node
80: second node

The invention claimed is:

1. A relay control system comprising:
  a battery pack comprising a positive terminal and a negative terminal;
  a first main relay comprising both terminals connected between the positive terminal of the battery pack and a first node which is one end of a load;
  a second main relay comprising both terminals connected between the negative terminal of the battery pack and a second node which is the other end of the load;
  a first pre-charge unit connected to the second main relay in parallel and comprising a series circuit configured with a first pre-charge resistor and a first pre-charge relay;
  a second pre-charge unit connected to the first main relay in parallel and comprising a series circuit configured with a second pre-charge resistor and a second pre-charge relay; and
  an operational amplifier having both terminals connected to the first and second nodes and outputting a voltage applied to the load to an output terminal,
  wherein, prior to a pre-charging period before at least one of the first and second main relays is turned on, the first pre-charge relay is turned on and whether the first main relay and the second pre-charge relay are fused is determined according to a voltage value output from the operational amplifier, or the second pre-charge relay is turned on and whether the second main relay and the first pre-charge relay are fused is determined according to a voltage value output from the operational amplifier.

2. The relay control system of claim 1, wherein the battery pack is any one selected from between batteries for power of a hybrid and pure electric vehicle.

3. A relay control method of a relay control system comprising: a battery pack comprising: a positive terminal and a negative terminal; a first main relay comprising both terminals connected between the positive terminal of the battery pack and a first node which is one end of a load; a second main relay comprising both terminals connected between the negative terminal of the battery pack and a second node which is the other end of the load; a first pre-charge unit connected to the second main relay in parallel and comprising a series circuit configured with a first pre-charge resistor and a first pre-charge relay; a second pre-charge unit connected to the first main relay in parallel and comprising a series circuit configured with a second pre-charge resistor and a second pre-charge relay; and an operational amplifier having both terminals connected to the first and second nodes and outputting a voltage applied to the load to an output terminal, the method comprising prior to a pre-charging period before at least one of the first and second main relays is turned on:

turning the first pre-charge relay on;

a first voltage measuring step for measuring a voltage value applied to the load by means of the operational amplifier, after a first predetermined time elapses;

a first determining step for determining whether the voltage value measured in the first voltage measuring step is greater than a first preset threshold value;

a second determining step for determining whether the voltage value measured in the first voltage measuring step is greater than a second preset threshold value which is greater than the first preset threshold value when the voltage value is greater than the first preset threshold value according to the determined result in the first determining step;

a first checking step for checking whether the first main relay is fused when the voltage value measured in the first voltage measuring step is greater than the second preset threshold value according to the determined result in the second determining step; and a second checking step for checking whether the second pre-charge relay is fused when the voltage value measured in the first voltage measuring step is smaller than the second preset threshold value according to the determined result in the second determining step, or the method comprising prior to a pre-charging period before at least one of the first and second main relays is turned on:

turning the second pre-charge relay on;

a second voltage measuring step for measuring a voltage value applied to the load by means of the operational amplifier, after a second predetermined time elapses;

a third determining step for determining whether the voltage value measured in the second voltage measuring step is greater than the first preset threshold value;

a fourth determining step for determining whether the voltage value measured in the second voltage measuring step is greater than a third preset threshold value which is greater than the first preset threshold value when the voltage value is greater than the first preset threshold value according to the determined result in the third determining step;

a third checking step for checking whether the second main relay is fused when the voltage value measured in the second voltage measuring step is greater than the third preset threshold value according to the determined result in the fourth determining step; and a fourth checking step for checking whether the first pre-charge relay is fused when the voltage value measured in the second voltage measuring step is smaller than the third preset threshold value according to the determined result in the fourth determining step.

4. The relay control method of claim 3, wherein the first determining step further comprises turning the first pre-charge relay off when the voltage value measured in the first voltage measuring step is smaller than the first preset threshold value according to the determined result in the first determining step.

5. The relay control method of claim 3, further comprising, turning on the second main relay when the voltage value measured in the second voltage measuring step is smaller than the first preset threshold value according to the determined result in the third determining step;

turning on the first main relay; and turning off the second pre-charge relay.

6. The relay control method of claim 3, wherein the first predetermined time is a time taken for a capacitor connected to both terminals of the load to be charged to a certain level or more by a current flowing through the first pre-charge relay or the second pre-charge relay when at least one of the first main relay and the second pre-charge relay is fused, and the second predetermined time is a time taken for a capacitor connected to both terminals of the load to be charged to a certain level or more by a current flowing through the first pre-charge relay or the second pre-charge relay when at least one of the second main relay and the first pre-charge relay is fused.

7. The relay control method of claim 3, wherein the first preset threshold value is set within 5% of a maximum voltage value applied to the load.

* * * * *